United States Patent
Udagawa et al.

(10) Patent No.: US 7,465,499 B2
(45) Date of Patent: Dec. 16, 2008

(54) BORON PHOSPHIDE-BASED SEMICONDUCTOR DEVICE, PRODUCTION METHOD THEREOF, LIGHT-EMITTING DIODE AND BORON PHOSPHIDE-BASED SEMICONDUCTOR LAYER

(75) Inventors: Takashi Udagawa, Chichibu (JP); Tamotsu Yamashita, Chiba (JP)

(73) Assignee: Showa Denko K.K., Tokyo (JP)

( * ) Notice: Subject to any disclaimer, the term of this patent is extended or adjusted under 35 U.S.C. 154(b) by 324 days.

(21) Appl. No.: 10/502,597

(22) PCT Filed: Jan. 28, 2003

(86) PCT No.: PCT/JP03/00798
§ 371 (c)(1), (2), (4) Date: Jan. 14, 2005

(87) PCT Pub. No.: WO03/065465
PCT Pub. Date: Aug. 7, 2003

(65) Prior Publication Data
US 2005/0121693 A1   Jun. 9, 2005

Related U.S. Application Data

(60) Provisional application No. 60/356,756, filed on Feb. 15, 2002, provisional application No. 60/356,738, filed on Feb. 15, 2002.

(30) Foreign Application Priority Data

Jan. 28, 2002 (JP) .............................. 2002-018188
Feb. 4, 2002 (JP) .............................. 2002-026271

(51) Int. Cl.
- B32B 17/06 (2006.01)
- C30B 23/00 (2006.01)
- C30B 25/00 (2006.01)
- C30B 28/12 (2006.01)
- C30B 28/14 (2006.01)
- H01L 21/00 (2006.01)
- H01L 21/28 (2006.01)

(52) U.S. Cl. .................. 428/446; 117/88; 117/89; 117/104; 117/105; 257/94; 257/96; 257/183; 257/189; 257/200; 438/46; 438/47; 438/604

(58) Field of Classification Search .................. 117/88, 117/89, 104, 105; 257/94, 96, 183, 189, 257/200; 428/446; 438/46, 47, 604
See application file for complete search history.

(56) References Cited

U.S. PATENT DOCUMENTS

| 6,069,021 A | 5/2000 | Tsuzaki et al. |
| 2001/0036678 A1 | 11/2001 | Udagawa |
| 2003/0234400 A1* | 12/2003 | Udagawa ................. 257/80 |

FOREIGN PATENT DOCUMENTS

JP    2001-284643 A    10/2001

OTHER PUBLICATIONS

Katsufusa Shono; "Physics Engineering Empiric Test 2"; Semiconductor Technology; Tokyo University Publication Society, May 17, 1976.

(Continued)

*Primary Examiner*—Callie Shosho
*Assistant Examiner*—Jonathan C Langman
(74) *Attorney, Agent, or Firm*—Sughrue Mion, PLLC

(57) ABSTRACT

A boron phosphide-based semiconductor device enhanced in properties includes a substrate (11) composed of a {111}-Si single crystal having a surface {111} crystal plane and a boron phosphide-based semiconductor layer formed on the surface of the substrate and composed of a polycrystal layer (12) that is an aggregate of a plurality of a triangular pyramidal single crystal entities (13) of the boron phosphide-based semiconductor crystal, where in each single crystal entity has a twining interface that forms an angle of 60° relative to a <110> crystal direction of the substrate.

8 Claims, 4 Drawing Sheets

OTHER PUBLICATIONS

Masao Doyama et al; "Crystalline Electron Microscope Studies"; The Material Science Series; Nov. 25, 1997.

Hiroo Yonezu; "Optical Communication Element Engineering"; Feb. 15, 1984.

C.W. Bunn; "Chemical Crystallography X-Ray Petrofabric Parsing Introduction: Chemical Crystallography—An Introduction to Optical and X-Ray Methods"; Jun. 15, 1970.

Syono Katsufusa; "Physics Engineering Experiment 2"; Semiconductor Technology; Tokyo University Publication Society; May 17, 1976.

M. Takigawa, et al.: "Hetero-Epitaxial Growth of BP on Si Substrate", Japanese Journal Of Applied Physics, 1974, vol. 13, pp. 411-416, XP001189366, ISSN: 0021-4922 p. 411-414.

T. Nishinaga, et al: "Effect of Growth Parameters For BP On Si Epitaxy", Japanese Journal Of Applied Physics, 1975, vol. 14, pp. 753-760, XP001189367, ISSN: 0021-4922 p. 753-756.

Y. Kumashiro, et al: "Crystal Growth Of Thick Wafers Of Boron Phosphide", Journal Of Crystal Growth, 1984, vol. 70, pp. 507-514, XP001189770, ISSN: 0022-0248, p. 507-510.

Y. Hirai, et al. "Crystalline Properties of BP Epitaxially Grown on Si Substrates", Journal Of Crystal Growth, 1977, vol. 41, pp. 124-132, XP001189356, ISSN: 0022-0248.

K. Shohno, et al. "Epitaxial Growth of BP Compounds on SI Substrtates", Journal Of Crystal Growth, 1974, vol. 24-25, pp. 193-196, XP001189359, ISSN: 0022-0248.

International Search Report for PCT/JP03/00798 dated Apr. 23, 2004.

* cited by examiner

F I G. 1
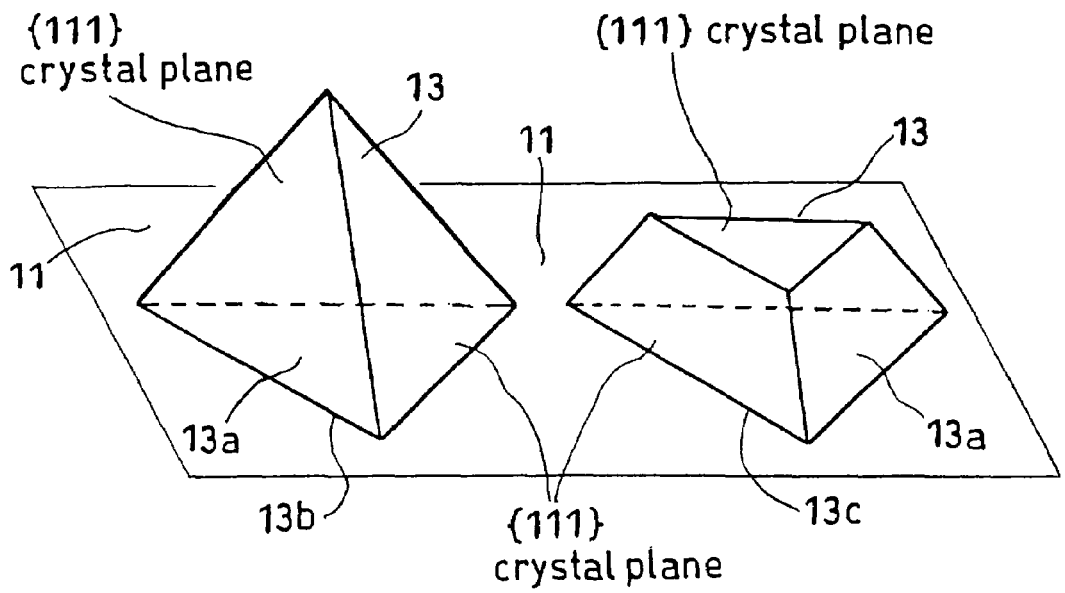
F I G. 2
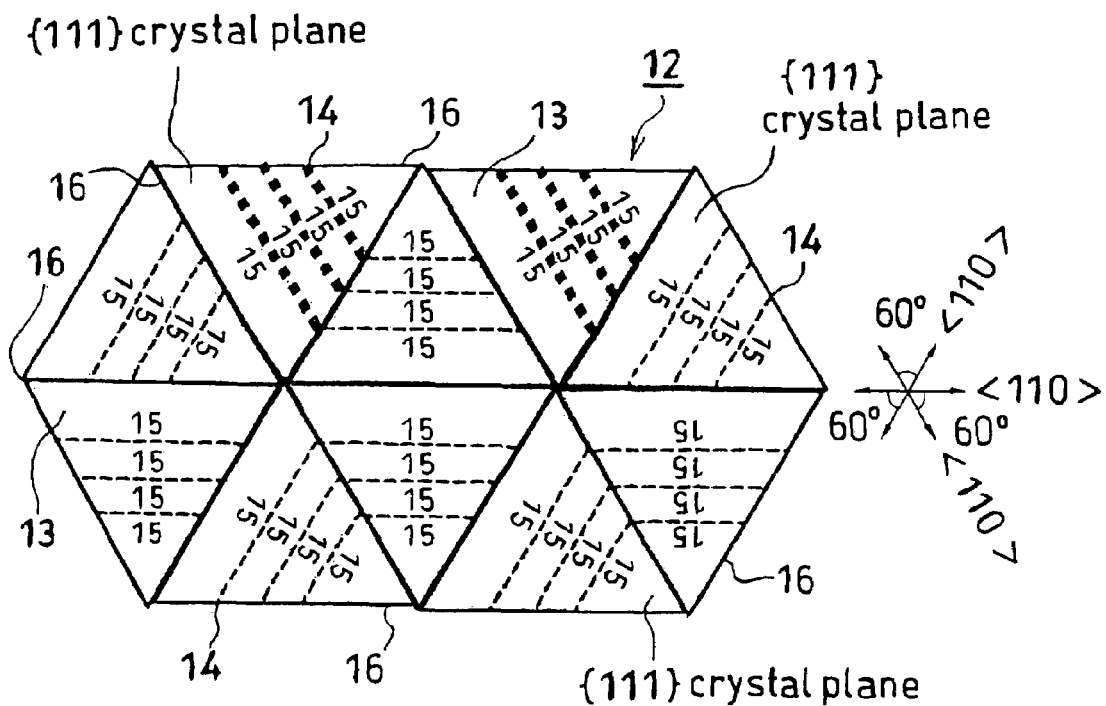

BORON PHOSPHIDE-BASED SEMICONDUCTOR DEVICE, PRODUCTION METHOD THEREOF, LIGHT-EMITTING DIODE AND BORON PHOSPHIDE-BASED SEMICONDUCTOR LAYER

CROSS REFERENCES TO RELATED APPLICATIONS

This application is a National Stage of International Application No. PCT/JP03/00798 filed on Jan. 28, 2003, claiming priority based on Japanese Patent Application No. 2002-18188, filed Jan. 28, 2002 and Japanese Patent Application No. 2002-26271 filed Feb. 4, 2002 and claiming the benefit pursuant to §119(e)(1) of the filing date of Provisional Application Ser. Nos. 60/356,738 and 60/356,756, both filed Feb. 15, 2002 pursuant to 35 U.S.C. §111(b).

TECHNICAL FIELD

The present invention relates to a crystal structure of a boron phosphide-based semiconductor layer formed on a silicon (Si) single crystal (silicon) substrate, which is suitable for obtaining a boron phosphide-based semiconductor device, to a boron phosphide-based semiconductor device having the structure, to a method of producing the semiconductor device and to a light-emitting diode.

BACKGROUND ART

There are conventionally known techniques of forming by the use of boron phosphide (BP) a semiconductor light-emitting device, such as a light-emitting diode (LED) and a laser diode (LD), which is one of boron phosphide semiconductors containing boron (B) and phosphorus (P) as constituent elements (see, U.S. Pat. No. 6,069,021). Conventional boron phosphide light-emitting devices are fabricated using, for example, a stacked layer structure where a boron phosphide layer is formed as a buffer layer on a substrate composed of a silicon single crystal (silicon) (see, U.S. Pat. No. 6,069,021, supra). In recent years, there has been invented a stacked layer structure for semiconductor light-emitting devices, which has a light-emitting part comprising a pn-junction double hetero structure that uses as a clad layer a boron phosphide layer with a wide bandgap (see, Japanese Patent Application No. 2001-158282).

It has been heretofore known that on a silicon substrate, a boron phosphide single crystal layer comprising the same crystal plane as the crystal plane constituting the substrate surface grows. For example, on a {100}-Si single crystal substrate, the surface of which is a {100} crystal plane, a boron phosphide single crystal layer comprising {100} crystal planes stacked in parallel with the substrate surface is known to grow (see, "Semiconductor Technology (First Volume)" by Katsufusa SHONO, 9th imp., page 77, Tokyo University Publishing Association (Jun. 25, 1992)). It is also known that on a silicon substrate, a boron phosphide single crystal layer not containing a twin crystal (twinning) at all can be grown (see, "Semiconductor Technology (First Volume)", supra, page 98). On the other hand, it is known that a {100}-boron phosphide single crystal layer containing twining can also be obtained (see, "Semiconductor Technology (First Volume)", supra, pages 99-100).

Conventional techniques disclose that the twinning contained in a boron phosphide layer has a property of relaxing the mismatching ratio between crystal lattices (see, "Semiconductor Technology (First Volume)", supra, page 100). Accordingly, when a boron phosphide-based semiconductor layer containing twinning is used, this can contribute to the production of an LED having excellent characteristics including high emission intensity, for example. However, as disclosed in conventional techniques, the boron phosphide-based semiconductor layer containing twinning cannot be stably obtained. That is, conditions necessary for producing a boron phosphide-based semiconductor layer stably containing twinning -are not heretofore clarified and therefore a light-emitting device having excellent emission intensity, for example, cannot be stably obtained.

An object of the present invention is to provide a boron phosphide-based semiconductor layer comprising a crystal structure where twinning can be stably incorporated.

Another object of the present invention is to provide a boron phosphide-based semiconductor device improved in its properties by having the device provided with a polycrystalline boron phosphide-based semiconductor layer stably containing twinning and having a specific crystal surface as a twinning plane, and to provide a method of producing the boron phosphide-based semiconductor device.

Still another object of the invention is to provide an LED excellent in efficiency of taking out emitted light toward the outside.

Here, the boron phosphide-based semiconductor layer comprising the crystal structure the present invention aims at is not a conventional boron phosphide-based semiconductor layer comprising a film-form single crystal, but a boron phosphide-based semiconductor comprising a polycrystal that is an aggregate of single crystal entities different in the crystal direction of the twinning interface (twinning plane) (see, "Chemical Crystallography" by C. W. Van, 1st ed., pages 75-76, Baifukan (Jun. 15, 1970)).

DISCLOSURE OF THE INVENTION

The present invention provides a boron phosphide-based semiconductor device comprising a substrate composed of a silicon (Si) single crystal and a boron phosphide-based semiconductor layer formed on a surface of the substrate and composed of a boron phosphide-based semiconductor crystal having a crystal plane identical with a crystal plane constituting the surface of the substrate, wherein the substrate is composed of a {111}-Si single crystal having a surface of {111} crystal plane, the boron phosphide-based semiconductor layer is composed of a polycrystal layer that is an aggregate of a plurality of triangular pyramidal single crystal entities of the boron phosphide-based semiconductor crystal, each of the single crystal entities having a bottom face that is composed of a {111} crystal plane of the boron phosphide-based semiconductor crystal running parallel to the {111} crystal plane of the substrate, being surrounded by planes equivalent to the {111} crystal plane of the boron phosphide-based semiconductor crystal, and having a twinning interface that forms an angle of 60° relative to a <110> crystal direction of the substrate.

In the boron phosphide-based semiconductor device, the boron phosphide-based semiconductor layer has stacked thereon a group III-V compound semiconductor layer to form a hetero junction, and the group III-V compound semiconductor layer is composed of crystal planes arrayed at an interval agreeing with a spacing (lattice spacing) of crystal planes intersecting with surfaces of the single crystal entities constituting the boron phosphide-based semiconductor layer.

In the boron phosphide-based semiconductor device, each single crystal entity of the boron phosphide-based semiconductor layer comprises a boron monophosphide crystal.

The present invention also provides a method for producing the boron phosphide-based semiconductor device described above, comprising forming the boron phosphide-based semiconductor layer on the {111}-Si single crystal substrate at a temperature of 950 to 1,100° C. by a metal organic chemical vapor deposition (MOCVD) method at a growth rate of 20 to 60 nm/min.

In the method, the temperature can be not less than 1,025° C. and not more than 1,075° C., and the growth rate can be not less than 30 nm/min and not more than 40 nm/min.

The present invention also provides a light-emitting diode comprising the boron phosphide-based semiconductor device described above, wherein it has a light-emitting layer, an upper clad layer and a lower clad layer, and the polycrystal layer is used as the upper and lower clad layers.

In the light-emitting diode, the lower clad layer has a function to reflect light emitted from the light-emitting layer outside of the light-emitting diode and has emitted-light reflectance of not less than 30%.

In the light-emitting diode, the upper and lower clad layers can have a substantially identical thickness.

In the light-emitting diode, the lower clad layer has a thickness of d nm and the light emitted from the light-emitting layer has a wavelength of λ nm, and the thickness and wavelength have a relation $\lambda \approx 0.135 \cdot d + 380$ (provided that 420 nm$\leq \lambda \leq$490 nm).

The present invention also provides a boron phosphide-based semiconductor layer formed on a surface of a substrate composed of a silicon (Si) single crystal, comprising a boron phosphide-based semiconductor crystal having a crystal plane identical with a crystal plane constituting the surface of the substrate, wherein the substrate is composed of a {111}-Si single crystal having a surface of {111} crystal plane, the boron phosphide-based semiconductor layer is composed of a polycrystal layer that is an aggregate of a plurality of triangular pyramidal single crystal entities of the boron phosphide-based semiconductor crystal, each of the entities having a bottom face that is composed of a {111} crystal plane of the boron phosphide-based semiconductor crystal running parallel to the {111} crystal plane of the substrate and being surrounded by planes equivalent to the {111} crystal plane of the boron phosphide-based semiconductor crystal, and having a twinning interface that forms an angle of 60° relative to a <110> crystal direction of the substrate.

According to the present invention, as described above, since the boron phosphide-based semiconductor layer provided on the Si single crystal substrate is composed of a polycrystal layer that is an aggregate of single crystal entities containing twinning capable of absorbing misfit dislocation and preventing the propagation of dislocation, it is possible to construct a boron phosphide-based semiconductor layer excellent in crystallinity and reduced in the dislocation density. As a result, it is possible to provide a boron phosphide-based semiconductor device using the boron phosphide-based semiconductor layer and having excellent characteristics, such as high emission intensity, excellent rectification property and high breakdown voltage.

In addition, since the upper and lower clad layers sandwiching the light-emitting layer of the light-emitting diode according to the present invention are composed of the polycrystal layer that is an aggregate of a plurality of single crystal entities including the twining and since the lower clad layer is adjusted to have a thickness that can bring about emitted-light reflection of not less than 30%, it is possible to provide a light-emitting diode excellent in efficiency of taking out emitted light toward the outside.

BRIEF DESCRIPTION OF THE DRAWINGS

FIG. 1 is a schematic view showing the form of a single crystal entity constituting the polycrystal layer according to the present invention.

FIG. 2 is a schematic plan view showing the structure of the polycrystal layer according to the present invention.

BEST MODE FOR CARRYING OUT THE INVENTION

Figure 3:
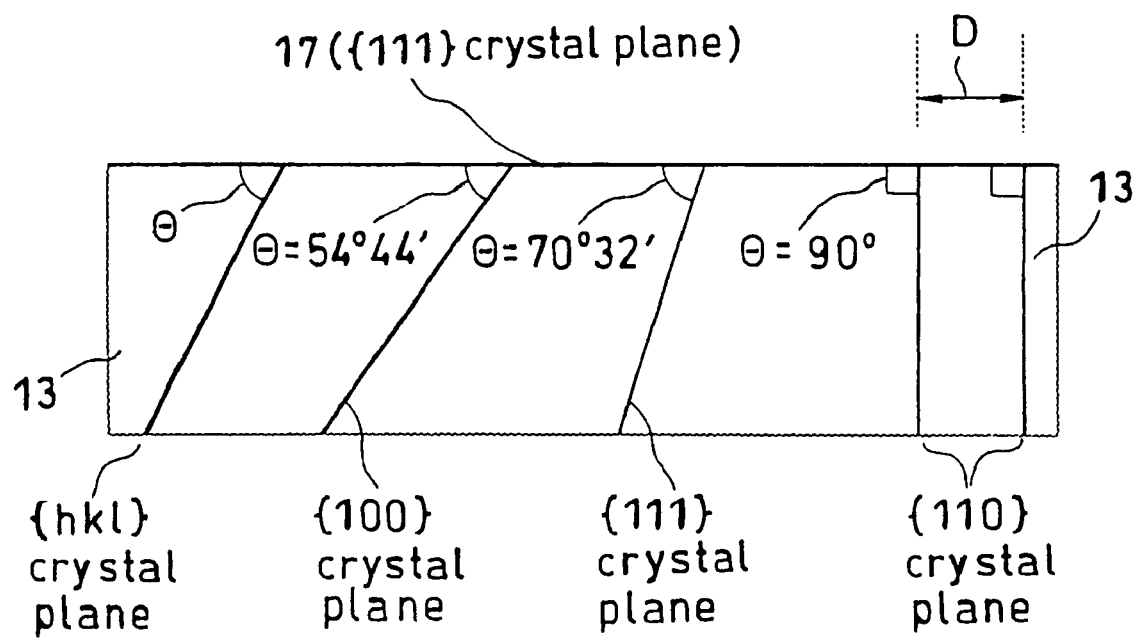
FIG. 3 is a schematic view showing crystal planes intersecting with the {111} crystal plane of the boron phosphide-based semiconductor layer according to the present invention.

In the present invention, the boron phosphide-based semiconductor layer can be suitably formed on a Si single crystal substrate having a {111} crystal plane surface (in this description, this substrate is referred to as a {111}-Si single crystal substrate). On the {111} crystal plane of a diamond crystal structure Si single crystal, silicon atoms are more densely present than on the {100} or {110} crystal plane. Therefore, the {111}-Si single crystal substrate is advantageous in that the constituent elements of a boron phosphide-based semiconductor layer deposited on the substrate can be prevented from diffusing in or penetrating through the interior of the substrate. This is effective in constituting a clear junction interface. Also, when the {111}-Si single crystal substrate has electrical conductivity, this provides an effect of, for example, facilitating the fabrication of a light-emitting device, because an ohmic electrode having either positive or negative polarity can be provided on the back surface as a back electrode. In particular, an electrically conducting single crystal substrate having a low resistivity (specific resistance) of 1 mΩ·cm or less, preferably 0.1 mΩ·cm or less, contributes to the production of an LED having a low forward voltage (so-called Vf). Furthermore, this substrate has excellent heat radiation property and therefore, is effective in fabricating an LD for which stable oscillation is ensured.

The boron phosphide-based semiconductor layer stacked, as a polycrystal layer, on the surface of the {111}-Si substrate is preferably a layer containing boron (B) and phosphorus (P) as constituent elements, such as a layer of $B_\alpha Al_\beta Ga_\gamma In_{1-\alpha-\beta-\gamma}P_{1-\delta}As_\delta$ (wherein $0<\alpha\leq 1, 0\leq \beta<1, 0\leq \gamma<1, 0<\alpha+\beta+\gamma\leq 1$ and $0\leq \delta<1$). Or, the polycrystal layer can be composed of, for example, a layer of $B_{60}Al_\beta Ga_\gamma In_{1-\alpha-\beta-\gamma}P_{1-\delta}N_\delta$ (wherein $0<\alpha\leq 1, 0\leq \beta<1, 0\leq \gamma<1, 0<\alpha+\beta+\gamma\leq 1$ and $0\leq \delta<1$). A boron monophosphide (BP) is particularly preferred because the constituent elements are only boron (B) and phosphorus (P), and the film formation is advantageously easier than the multi-element mixed crystal due to the small number of constituent elements. A boron phosphide, for example, grown by metal organic chemical vapor deposition (MOCVD) means under the conditions such that the growth rate is from 2 to 30 nm/min and the supply ratio (so-called V/III ratio) of raw materials between the group V element, such as phosphorus, and the group III element, such as boron, is from 15 to 60, becomes a wide bandgap semiconductor having a bandgap of about 3 eV at room temperature. The boron phosphide semiconductor layer having such a wide bandgap can be used, for example, as a clad layer for a light-emitting layer in a light-emitting device.

In the present invention, the boron phosphide-based semiconductor layer that is the polycrystal layer is constructed by aggregating a plurality of single crystal entities comprising a boron phosphide-based semiconductor crystal. FIG. 1 schematically shows the form of the single crystal entity constituting the polycrystal layer according to the present invention. Each single crystal entity 13 on a {111}-Si single crystal substrate 11 has an outer shape of a regular triangular pyramidal body 13b, the periphery of which is surrounded by planes equivalent to the {111} crystal plane of a boron phosphide-based semiconductor crystal, or a regular triangular pyramidal body 13c, the top part of which has a {111} crystal plane. The bottom face 13a of each single crystal entity 13 is composed of a {111} crystal plane of a boron phosphide-based semiconductor crystal disposed in parallel with the {111} crystal plane of the {111}-Si single crystal substrate. The bottom face 13a means a crystal plane contacting the surface of the {111}-Si single crystal substrate 11.

As shown in a schematic plan view of FIG. 2, the polycrystal layer 12 of the present invention is constructed by connecting a plurality of triangular pyramidal single crystal entities 13 with each other. Respective single crystal entities 13 are connected with each other through a junction face 16. Inside each single crystal entity 13, twinning 15 is present. The direction in which the twinning plane 14 of the twinning incorporated inside each single crystal entity exists is not uniformly constant and therefore, the boron phosphide-based semiconductor layer composed of single crystal entities 13 containing twinning in different crystal directions is referred to as a polycrystal layer 12 in the present invention. Particularly, in the present invention, the polycrystal layer 12 is constructed by aggregating single crystal entities 13 each having twinning regularly incorporated to direct the twinning plane at an angle of 60° with respect to the <110> crystal direction of the {111}-Si single crystal constituting the substrate. The twinning plane as used herein specifically means a plane equivalent to the {111} crystal plane of the boron phosphide-based semiconductor crystal, namely, a crystal plane, such as {111}, {−1.−1.−1.}, {1.−1.1.}, etc. Also, the twinning plane is characterized by running parallel with any one of {111} crystal planes of the boron phosphide-based semiconductor crystal, constituting the periphery of the triangular pyramidal single crystal entity 13. By virtue of the generation of twinning 15 having a twinning plane 14 that is a {111} crystal plane of the boron phosphide-based semiconductor crystal, the generation and propagation of misfit dislocation ascribable to lattice mismatching between the Si single crystal substrate and the boron phosphide-based semiconductor crystal can be effectively suppressed. In the boron phosphide-based semiconductor crystal, the twinning having a {111} crystal plane as the twinning plane can be stably and easily formed as compared with twinning having a different crystal plane as the twinning plane. Accordingly, when the polycrystal layer 12 is constructed by aggregating single crystal entities each containing twinning having as the twinning plane a {111} crystal plane of the boron phosphide-based semiconductor crystal, an effect of stably suppressing the propagation of misfit dislocation can be provided.

The presence of twinning is known, for example, by the presence or absence of an abnormal diffraction spot on an electron diffraction pattern photographed using an electron diffraction technique (see, "Crystal Electron Microscopy" by Kimitomo SAKA, 1st ed. pages 111-113, Uchida Rokakuho (Nov. 25, 1997)). Also, by measuring the angle between the <110> crystal direction and the diffraction spot ascribable to twinning on a diffraction pattern photographed by entering an electron beam in parallel with the <110> crystal direction of the boron phosphide-based semiconductor layer, the angle formed by the <110> crystal direction and the twinning can be known. Incidentally, the twinning can be regarded as a kind of stacking fault (see, "Crystal Electron Microscopy", supra, page 112).

For obtaining the polycrystal layer according to the present invention that is an aggregate of single crystal entities each containing twinning, the conditions at the film formation have to be precisely controlled. In particular, a triangular pyramidal single crystal entity comprising a boron phosphide-based semiconductor crystal containing twinning having as the twinning plane a {111} crystal plane is formed by an atmospheric pressure metal organic chemical vapor deposition (MOCVD) method using a starting material system of triethylborane (($C_2H_5$)$_3$B)/phosphine ($PH_3$)/hydrogen ($H_2$) while precisely controlling the growth temperature. In the MOCVD method, the temperature for obtaining a boron phosphide-based semiconductor polycrystal layer, particularly, a polycrystal layer of boron monophosphide is preferably from 950 to 1,100° C., more preferably from 1,025 to 1,075° C. For forming a boron phosphide-based semiconductor polycrystal layer containing indium (In), a lower temperature of about 950 to about 1,000° C. is preferred and for forming a boron phosphide-based semiconductor polycrystal layer containing aluminum (Al) as a constituent element, a relatively high temperature of about 1,050 to 1,100° C. is preferred. At a high temperature exceeding about 1,200° C., a polyhedral boron phosphide, such as $BP_6$ or $B_{13}P_2$, is readily generated and this is disadvantageous in obtaining a boron phosphide-based semiconductor layer having a homogeneous composition.

For efficiently forming a single crystal entity having twinning therein, the growth rate is preferably from 20 to 60 nm/min. In the case of boron monophosphide (BP), the particularly preferable growth rate is from 30 to 40 nm/min. In a single crystal entity grown at a rate exceeding 60 nm, a large amount of twinning (stacking fault) and additionally, an abrupt increase in the density of other crystal faults, such as point defect and dislocation, are disadvantageously generated and a polycrystal layer having excellent crystallinity can be hardly obtained. On the contrary, if the growth rate is reduced, in other words, if a longer time is necessary for obtaining a boron phosphide-based semiconductor layer having a desired layer thickness, the occasion of causing volatilization of phosphorus (P) that is a constituent element increases at the growth time. Therefore, if the growth rate is as small as less than 20 nm/min, non-equilibrium abruptly occurs in the chemical equivalent ratio between the constituent elements of the boron phosphide-based semiconductor layer due to vaporization or volatilization of phosphorus (P). A boron phosphide-based compound semiconductor layer having a stoichiometrically non-equilibrium composition contains a large amount of point defect and therefore, is not suitable as the polycrystal layer for use in the present invention.

The twinning contained inside the single crystal entity has an activity of suppressing the propagation of misfit dislocation generated due to lattice mismatching, for example, between the silicon single crystal of the substrate and the boron phosphide-based semiconductor constituting the single crystal entity. For example, misfit dislocation generated from the junction interface between the Si substrate and the single crystal entity is absorbed by the twinning present inside the single crystal entity and prevented from propagating to the upper part. As a result, the density of dislocation passed through to reach the upper part of the single crystal entity is reduced.

For obtaining a single crystal entity reduced in the misfit dislocation, technical means of providing a buffer layer in the middle between the Si single crystal substrate and the boron phosphide-based semiconductor layer is also effective. The buffer layer is preferably composed of an amorphous or polycrystalline boron phosphide-based compound semiconductor layer. The amorphous or polycrystalline buffer layer exerts an effect of relaxing the lattice mismatching with the Si single crystal constituting the substrate and providing a boron phosphide-based semiconductor layer reduced in the density of the crystal defects, such as misfit dislocation. In particular, when the buffer layer is composed of a boron phosphide-based semiconductor, this provides an effect of forming a boron phosphide-based semiconductor layer having continuity on the buffer layer because boron and phosphorus act as "growth nuclei" accelerating the growth. In the case of constituting the buffer layer of boron phosphide, the layer thickness is preferably from about 1 to 50 nm, more preferably from 2 to 15 nm.

The surface layer part of the polycrystal layer constructed by aggregating single crystal entities containing twinning forms a region reduced in the misfit dislocation passed through from the lower Si single crystal substrate side, and favored with excellent crystallinity. Accordingly, on the boron phosphide-based semiconductor polycrystal layer having the constitution of the present invention, a deposited layer having excellent crystallinity can be grown. In particular, when the deposited layer is a crystal layer constituted of crystal planes arrayed at the same interval as the spacing (lattice spacing) of crystal lattices intersecting with the surface of the single crystal entity of the boron phosphide-based semiconductor forming the surface of the polycrystal layer, this is effective in obtaining a crystal layer reduced in the misfit dislocation and favored with excellent crystallinity. As schematically shown in FIG. 3, a lower Miller index {hkl} plane crossing the surface 17 composed of a {111} crystal plane of the single crystal entity includes {110} and {100} crystal planes in addition to the {111} crystal plane of h=k=l=1. The spacing (=D) of these {hkl} crystal planes on the surface of the {111} crystal plane of the single crystal is given, in the case of a cubic zinc blend-type boron phosphide-based semiconductor crystal, as $D (Å)=a/\{(h^2+k^2+l^2)^{1/2} \cdot \sin\theta\}$, wherein a (Å) denotes a lattice constant of the boron phosphide-based semiconductor crystal and θ denotes an angle (°) between the {111} crystal surface 17 and the crystal plane crossing it. Examples thereof include a case of depositing on the surface of a boron phosphide (BP) polycrystal layer, a layer of wurtzite-type gallium-indium nitride mixed crystal ($Ga_{0.94}In_{0.06}N$) having arrayed therein hexagonal (1.0.0.0.) crystal planes each agreeing in the lattice spacing (≈3.21 Å) with the {110} crystal plane orthogonally meeting the {111} crystal plane of the BP single crystal entity 13 constituting the surface of the BP polycrystal layer. Such a crystal layer having excellent crystallinity can be suitably used, for example, as a light-emitting layer giving high-intensity emission in a light-emitting device.

Examples of the boron phosphide-based semiconductor device that can be fabricated using the polycrystal layer composed of a boron phosphide-based semiconductor according to the present invention include an LED. The LED can be fabricated, for example, based on a stacked layer structure comprising a p-type {111}-Si single crystal substrate, a p-type boron phosphide (BP) polycrystal layer according to the present invention grown on the substrate through an amorphous buffer layer containing boron (B) and phosphorus (P), an n-type light-emitting layer on the polycrystal layer and an n-type boron phosphide (BP) polycrystal layer according to the present invention grown on the light-emitting layer. A polycrystal layer composed of single crystal entities of boron phosphide having a bandgap of about 3 eV at room temperature can be used as clad layers for sandwiching the light-emitting layer.

When the polycrystal layer is used as clad layers, the thickness d (nm) of the lower clad layer is set to a value giving high reflectance for the wavelength λ (nm) of light emitted from the light-emitting layer. Here, the wavelength of light emitted from the light-emitting layer is represented by the peak wavelength. The reflectance of the lower clad layer for light at a specific wavelength (=λ) changes depending on the layer thickness (=d). For example, in a boron phosphide (BP) layer provided on a Si single crystal substrate, the layer thickness (=d) giving high reflectance for light in the range of 420 nm≦λ≦490 nm can be approximately calculated by the following formula (1):

$$\lambda(nm) \approx 0.135 \cdot d + 380 \qquad (1)$$

For example, the thickness of the lower clad layer giving high reflectance for the emitted violet light at λ=420 nm is about 300 nm. A single layer composed of boron phosphide, provided on an Si single crystal substrate and having a thickness of about 300 to 320 nm, gives reflectance exceeding about 30% to about 40% for the emitted violet light at a wavelength of 420 nm. That is, the polycrystal layer having the thickness adjusted as described above can advantageously constitute, even if it is a single layer, a lower clad layer having high reflectance for light at a wavelength of λ emitted from the light-emitting layer.

Figure 7:
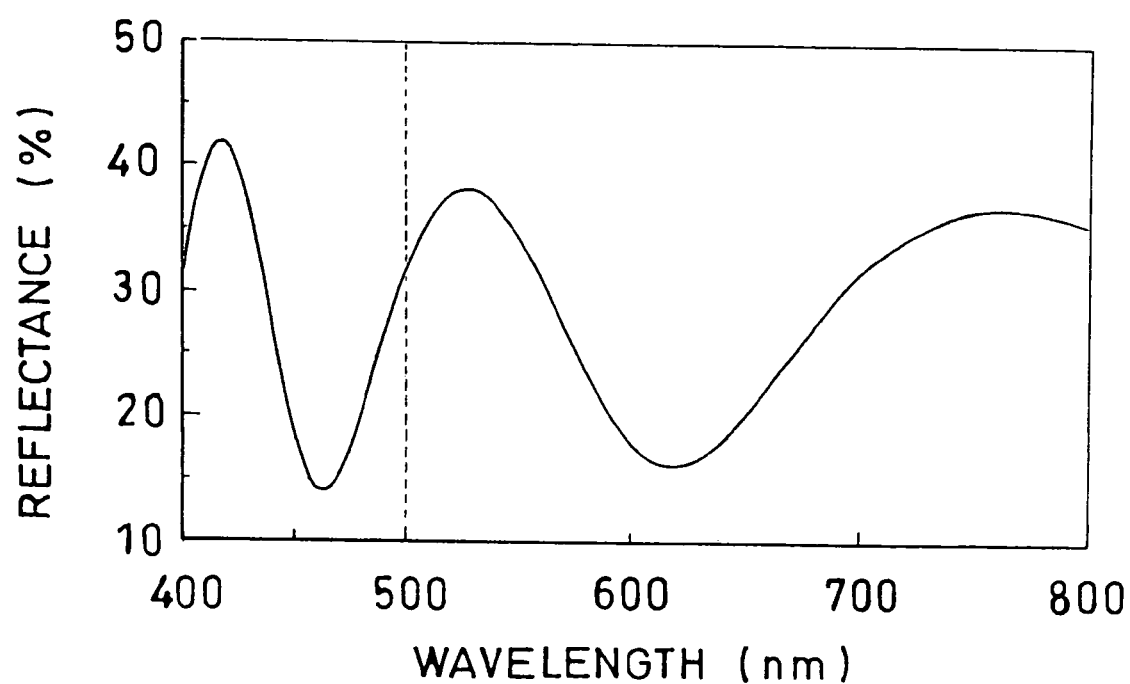
FIG. 7 shows an example of the wavelength dependency of the reflectance of a p-type boron phosphide layer.

The reflectance can be measured with a general reflectometer, spectral ellipsometer or the like using laser light or visible light as the light source. The reflectance is calculated from the intensity ratio between the incident light at a certain wavelength and the reflected light on the same plane as the incident light. The reflectance is also expressed based on the ratio between the intensity of incident light at a certain wavelength and the intensity of reflected light in all azimuths irrespective of the scattering azimuth. The two are not discriminated but generically called reflectance in some cases. However, the reflectance as used in the present invention is a value calculated from the intensity ratio between the incident light and the reflected light on the same plane. FIG. 7 shows an example of the wavelength dependency of the reflectance of an undoped p-type boron phosphide layer formed on a Si single crystal substrate. When the reflectance of the lower clad layer is less than about 30%, in an LED for example, the intensity of emitted light released in the outside view-field direction is not improved. This is considered to be complicatedly affected by the plane area in the region where the current for driving an LED (LED driving current) can diffuse, the light-shielding effect of the electrode located in the direction for taking out emitted light toward the outside, and the like. When a boron monophosphide layer having reflectance of 30% or more, formed on an Si single crystal substrate, is used as the lower clad layer, an LED having an excellent efficiency for taking out emitted light toward the outside can be fabricated. Actually, a polycrystal layer having a reflectance of 100% can be hardly obtained because there is a possibility of the polycrystal layer absorbing the emitted light. In practice, the reflectance of the lower clad layer, which contributes to the improvement of emission intensity of an LED, is not less than 30% and less than 100%.

The thickness (=d) of the lower clad layer can be controlled by the adjustment of the time necessary for the film formation of a polycrystal layer. Supposing d=1,000 nm, the wavelength (=λ) of emitted light, which can be suitably applied in the present invention, is calculated according to formula (1) above as about 515 nm or less. On the contrary, when the layer thickness is extremely small, a continuous film satisfactorily and evenly covering the surface of an amorphous layer can be hardly obtained. Also, when the growth time is extremely short and the film thickness is small, irregular film growth partly takes place on the amorphous layer and a discontinuous film inhomogeneous in the thickness results. Irregular asperities (inhomogenous thickness) bring about light scattering and inhibit the improvement of reflectance in the constant direction. For constituting a lower clad layer having uniform junction properties with the light-emitting layer and excellent surface flatness giving high reflectance, a lower clad layer having a thickness of about 100 nm or more is suitably used.

When the upper clad layer is composed of the same boron phosphide-polycrystal layer as the lower clad layer, the strains imposed on the light-emitting layer from the lower and upper clad layers sandwiching the light-emitting layer can be made almost equal in the quantity. This enables a light-emitting layer ensuring stable wavelength and excellent intensity of emitted light to be obtained. In particular, when the lower and upper clad layers are composed of the same boron phosphide polycrystal layer and have substantially the same thickness, the strains imposed on the light-emitting layer from the upper and lower sides of the light-emitting layer due to the difference in the coefficient of thermal expansion or the like between the materials of which the light-emitting layer and the clad layers are made, can be rendered more equal in the quantity. The "substantially the same thickness" as used herein means that the difference in the thickness is ±10%. As described above, the layer thickness suitable for constituting the lower clad layer that serves also as the reflecting mirror and is a single layer provided on an Si single crystal substrate and composed of boron phosphide, is determined by formula (1). Accordingly, it is optimal to also determine the thickness of the upper clad layer in accordance with formula (1). By making equal the quantities of strains imposed on the light-emitting layer from the upper and lower clad layers, the wavelength of emitted light can be prevented from unstably becoming a short wavelength, and stable emission of light having a wavelength corresponding to the bandgap of the light-emitting layer can be advantageously obtained.

The light-emitting layer sandwiched between the upper and lower clad layers can also be composed of a single or multiple quantum well structure having a well layer comprising $Ga_X In_{1-X} N$ ($0 \leq X \leq 1$) or $GaN_{1-Y}P_Y$ ($0 < Y \leq 1$). Incidentally, a barrier layer for the well layer can be composed of $Al_X Ga_{1-X} N$ ($0 \leq X \leq 1$) or $GaN_{1-Z}P_Z$ ($0 \leq Z < 1$, $Z<Y$). An n-type ohmic electrode is provided on the n-type boron phosphide polycrystal layer forming the surface layer of the stacked layer structure, and a p-type ohmic electrode is disposed on the back surface of the p-type Si single crystal substrate, whereby an LED having a pn-junction hetero structure can be fabricated.

An electronic device, such as hetero junction field effect transistor (FET), can be fabricated from a stacked layer structure comprising an undoped high-resistance {111}-Si single crystal substrate, an oxygen-containing high-resistance boron phosphide polycrystal layer grown on the substrate through a polycrystalline buffer layer containing boron (B) and phosphorus (P), and a high-purity n-type gallium nitride (GaN) layer provided on the polycrystal layer as an active layer (electron channel layer). The FET is fabricated by providing a Schottky junction gate electrode on the active layer and providing source and drain ohmic electrodes at the positions opposing each other through the gate electrode on the surface of an n-type contact layer stacked on the active layer.

The single crystal entity containing twinning and composed of a boron phosphide-based semiconductor crystal of the present invention has an activity of preventing upward propagation of misfit dislocation ascribable to the lattice mismatching between the Si single crystal substrate and the boron phosphide-based semiconductor.

EXAMPLES

The present invention is described in more detail below with reference to a case where an LED is fabricated from a stacked layer structure comprising a {111}-Si single crystal substrate having provided thereon a boron phosphide (BP) layer comprising a polycrystal layer.

Figure 4:
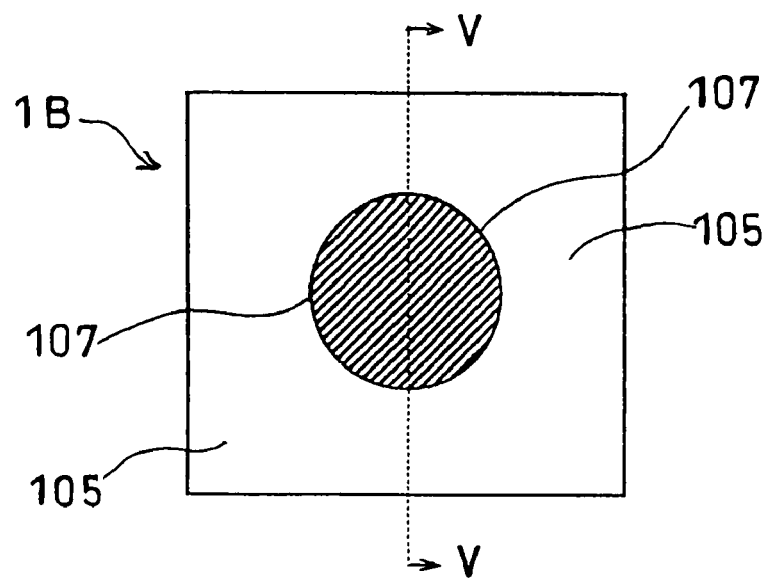
FIG. 4 is a schematic plan view of the LED according to Example of the present invention.
Figure 5:
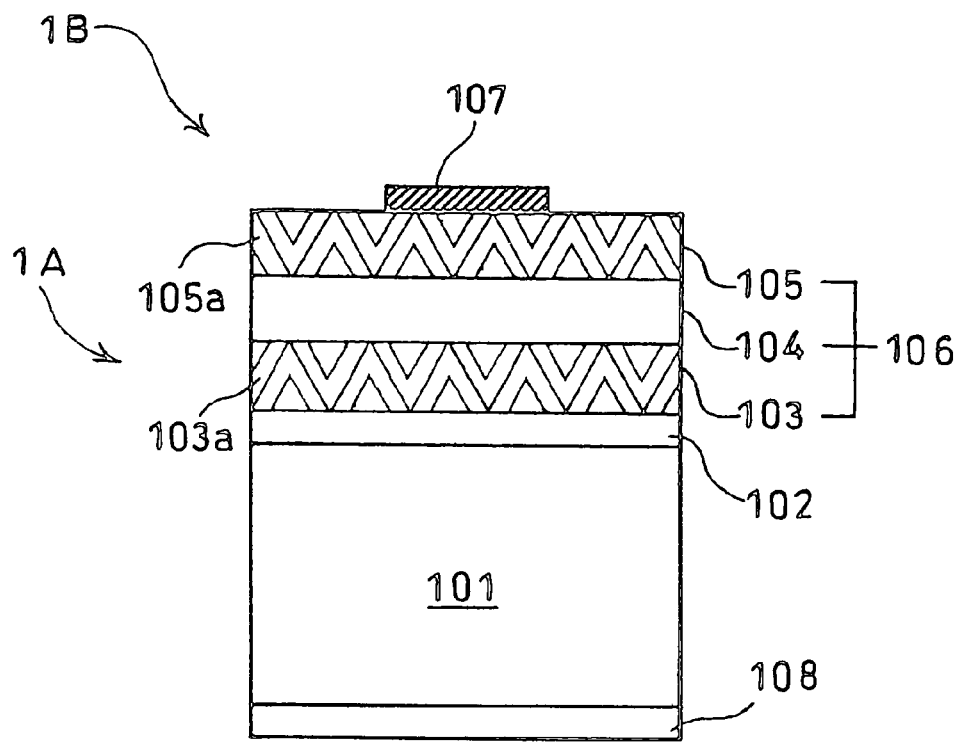
FIG. 5 is a cross-sectional schematic view of the LED taken along line V-V of FIG. 4.

FIG. 4 is a schematic plan view of an LED 1B according to the present invention, and FIG. 5 a schematic cross section of the LED 1B taken along line V-V in FIG. 4.

In a stacked layer structure 1A for use in the LED 1B, a boron-doped p-type Si single crystal having a plane offset by 2° from the {111} plane was constructed as a substrate 101. On the substrate 101, a buffer layer 102 composed of boron phosphide mainly comprising an amorphous one in the as-grown state was deposited at 350° C. by an atmospheric-pressure MOCVD method using a triethylborane (($C_2H_5)_3B$)/phosphine ($PH_3$)/hydrogen ($H_2$) system. The thickness of the buffer layer 102 thus deposited was about 10 nm.

On the surface of the buffer layer 102, a p-type boron phosphide (BP) layer 103 composed of a polycrystal layer was stacked as a lower clad layer at 1,050° C. with vapor phase growth means used in the aforementioned MOCVD method. The growth rate was set to 40 nm/min. The carrier concentration of the p-type boron phosphide (BP) layer 103 was $1 \times 10^{19}$ cm$^{-3}$, the thickness thereof was about 400 nm, and the bandgap thereof at room temperature was about 3.0 eV.

Figure 6:
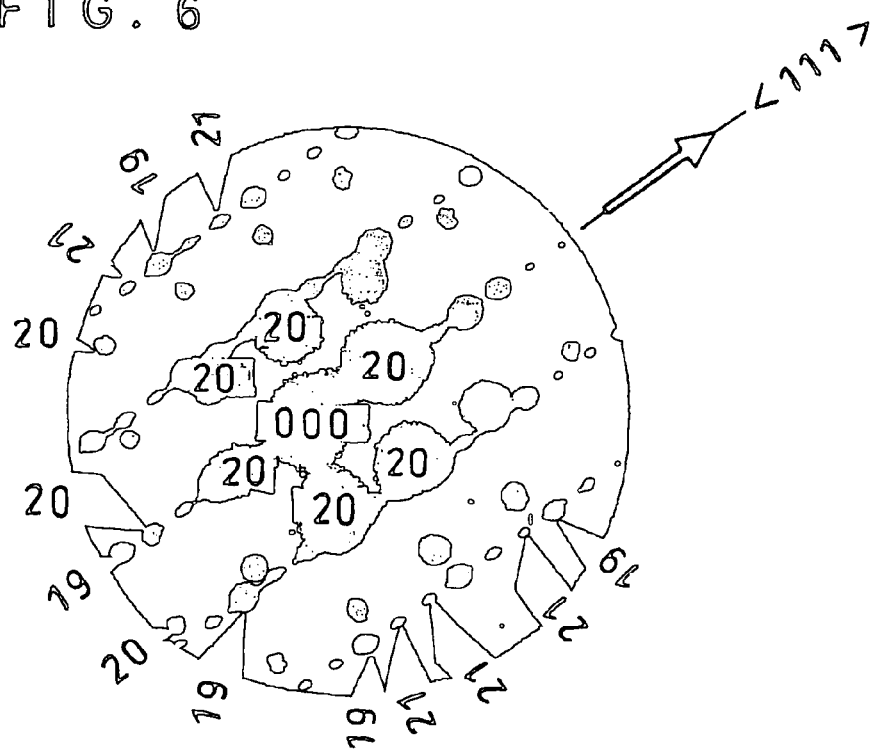
FIG. 6 is a view showing the electron beam diffraction pattern of the boron phosphide layer according to Example of the present invention.

The crystal structure inside the p-type boron phosphide layer 103 was analyzed from the cross-sectional TEM image and the electron beam diffraction pattern using a transmission electron microscope (TEM). FIG. 6 is a copy showing a diffraction pattern of the p-type boron phosphide layer 103, obtained by injecting an electron beam in parallel with the <110> crystal direction of the Si single crystal substrate 101. As shown in FIG. 6, a diffraction spot 19 attributable to the {111} crystal plane of each single crystal entity 103a constituting the p-type boron phosphide layer 103 composed of a polycrystal layer was positioned in parallel with the <111> crystal direction and adjacent to a diffraction spot 20 attributable to the (111) crystal plane of the Si single crystal substrate 101. From this, it was revealed that the single crystal entity 103a is a crystal entity where the {111} crystal plane of boron phosphide is stacked in parallel with the <111> crystal direction on the surface of the Si single crystal substrate. Furthermore, as shown in the diffraction pattern of FIG. 6, diffraction spots 21 attributable to twinning having a {111} crystal plane as the twinning plane were also observed in the vicinity of the diffraction spots of the single crystal entity 103a aligning in the <111> crystal direction of the Si single crystal substrate 101 and were symmetrically positioned, with the diffraction spots of the single crystal entity 103a as the symmetrical points. From this, it was confirmed that the single crystal entity 103a contains twinning having a {111} crystal plane as the twinning plane. It was confirmed from the position of the diffraction spot 21 attributable to the twinning that the twinning plane was present in the direction of 60° with respect to the <110> crystal direction of the BP crystal.

On the surface of the p-type boron phosphide layer 103, a light-emitting layer 104 composed of hexagonal n-type gallium indium nitride ($Ga_{0.90}In_{0.10}N$) was stacked at 850° C. by an atmospheric-pressure MOCVD method using a system of trimethyl gallium (($CH_3$)$_3$Ga)/trimethyl indium (($CH_3$)$_3$In)/ammonia ($NH_3$)/hydrogen ($H_2$). The thickness of the light-emitting layer 104 thus stacked was about 10 nm.

On the surface of the light-emitting layer 104, an undoped n-type boron phosphide layer 105 composed of a polycrystal layer was stacked as an upper clad layer at 1,050° C. using vapor phase growth means used in the aforementioned MOCVD method. The growth rate was set to 30 nm/min. Similarly to the p-type boron phosphide layer 103, the n-type boron phosphide layer 105 was constructed by an aggregate of regular tetrahedral single crystal entities 105a comprising the {111} crystal plane of BP. The carrier concentration of the n-type boron phosphide layer 105 was $8 \times 10^{18}$ $cm^{-3}$ and the thickness thereof was about 300 nm. The bandgap of the n-type boron phosphide layer 105 at room temperature was about 3.0 eV.

From the electron beam diffraction pattern, it was observed that the {111} crystal planes of the single crystal entities 105a constituting the n-type boron phosphide layer 105 were arrayed in parallel with the <111> crystal direction of the {111}-Si single crystal substrate 101. Inside the single crystal entity 105a, the presence of twinning having a {111} crystal plane of the BP crystal as the twinning plane was confirmed. The twinning plane was present in the direction of 60° with respect to the <110> crystal direction of the BP crystal.

A light-emitting part 106 of a pn-junction double hetero (DH) structure was constructed from the p-type boron phosphide layer 103 and the n-type boron phosphide layer 105, each having a bandgap of about 3.0 eV at room temperature, and the light-emitting layer 104 composed of a material having the same lattice plane spacing as the layers 103 and 105.

In the center part on the surface of the n-type boron phosphide layer 105, a circular n-type ohmic electrode 107 serving also as a pad electrode was disposed. The n-type ohmic electrode 107 was composed of a multilayer structure obtained by vacuum depositing films of Au—Ge alloy/Ni/Au. The diameter of the n-type ohmic electrode 107 was about 120 μm. Furthermore, a p-type ohmic electrode 108 was disposed on the almost entire back face of the p-type Si single crystal substrate 101, thereby completing the LED 1B. The p-type ohmic electrode 108 was composed of a vacuum deposited aluminum (Al) film. The Si single crystal substrate 101 was cut in the directions parallel and perpendicular to the [211] direction to form a square LED 1B having a one-side length of about 300 μm.

After connecting a gold (Au) wire to the n-type ohmic electrode 107, an operating current of 20 mA was passed in the forward direction between the n-type ohmic electrode 107 and the p-type ohmic electrode 108, and the emission properties were examined. The emission center wavelength was about 420 nm, and the full width at half mximum (FWHM) of the emission spectrum was about 32 nm. In the present invention, the light-emitting layer 104 was formed by using the p-type boron phosphide layer 103 reduced in the density of misfit dislocation as the underlying layer, so that a non-emitting dark line (see, "Optical Communication Device Engineering, Light-Emitting/Photo-Diode Device" by Hiroo YONETSU, 5th ed., pages 155-156, Kogaku Tosho (May 20, 1995)) was not discernibly confirmed in the light-emitting region, and light emission almost uniform in the intensity was given from the entire surface in the light-emitting region. The brightness in the chip state as measured using a general integrating sphere was about 8 mcd. Thus, an LED having high emission intensity was provided. With respect to the current-voltage (I-V) characteristics of the LED 1B, no occurrence of local breakdown due to the effect of dislocation was observed, and it was revealed that from the structure of the present invention, a pn-junction light-emitting part 106 exhibiting good pn-junction-property (rectification property) was obtained. The forward voltage (so-called Vf) determined from the I-V characteristics was 3.6 V (forward current=20 mA) and the reverse voltage was 6 V (reverse current=10 μA. Thus, an LED having high breakdown voltage was provided.

Industrial Applicability:

In the present invention, a boron phosphide-based semiconductor layer provided on a Si single crystal substrate having a surface of {111}-crystal plane is composed of a polycrystal layer that is an aggregate of single crystal entities containing twinning capable of absorbing misfit dislocation and preventing the propagation of dislocation, so that a boron phosphide-based semiconductor layer having excellent crystallinity and reduced in the dislocation density can be constructed. By using this, it is possible to provide a boron phosphide-based semiconductor device having excellent characteristics, such as a born phosphide-based semiconductor light-emitting device having high emission intensity, excellent rectification property and high breakdown voltage.

Furthermore, in the present invention a light-emitting diode is constituted using, as upper and lower clad layers sandwiching a light-emitting layer, a polycrystal layer that is an aggregate of single crystal entities including twining, and the lower clad layer is adjusted to have a thickness that can bring about emitted-light reflection of not less than 30%. Therefore, it is possible to suppress absorption of emitted light by a Si single crystal substrate and enhance an efficiency of taking out the emitted light toward the outside.

Moreover, by making the upper and lower clad layers of the same material and forming them to have substantially the same thickness, it is possible to make equal the quantities of strains imposed on the light-emitting layer from the upper and lower directions of the light-emitting layer. This can prevent the wavelength of the emitted light from unstably becoming a short wavelength by virtue of the strains imposed. Thus, it is possible to provide a light-emitting diode that can stably emit light having a wavelength corresponding to the bandgap of the light-emitting layer.

The invention claimed is:

1. A boron phosphide-based semiconductor device comprising:
   a silicon single crystal substrate (11);
   a boron phosphide-based polycrystalline layer formed on a {111} surface of said substrate; and
   a group III-V compound semiconductor layer stacked on said boron phosphide-based polycrystalline layer to form a hetero junction on the boron phosphide-based polycrystalline layer;
   wherein the boron phosphide-based polycrystalline layer is composed of an aggregate of a plurality of triangular pyramidal or truncated triangular pyramidal single crystal entities (13);
   each of said entities having a {111} bottom face (13a) that is parallel to said {111} surface of the substrate, having {111} side faces (15) and having a twinning interface that forms an angle of 60° relative to a <110> direction of said substrate; and
   wherein the group III-V compound semiconductor layer is composed of crystal planes arrayed at an interval agreeing with a lattice spacing of crystal planes intersecting with surfaces of the single crystal entities (13).

2. The boron phosphide-based semiconductor device according to claim 1, wherein each single crystal entity (13) of the boron phosphide-based polycrystalline layer comprises a boron monophosphide crystal.

3. A method for producing the boron phosphide-based semiconductor device set forth in claim 1, comprising forming the boron phosphide-based polycrystalline layer on the {111}-Si single crystal substrate at a temperature of 950 to 1,100° C. by a metal organic chemical vapor deposition (MOCVD) method at a growth rate of 20 to 60 nm/min.

4. The method according to claim 3, wherein the temperature is not less than 1,025° C. and not more than 1,075° C., and the growth rate is not less than 30 nm/min and not more than 40 nm/min.

5. A light-emitting diode comprising the boron phosphide-based semiconductor device set forth in claim 1, wherein it has a light-emitting layer (104), an upper clad layer (105) and a lower clad layer (103), and the polycrystalline layer (12) is used as the upper and lower clad layers.

6. The light-emitting diode according to claim 5, wherein the lower clad layer has a function to reflect light emitted from the light-emitting layer (104) outside of the light-emitting diode and has emitted-light reflectance of not less than 30%.

7. The light-emitting diode according to claim 5, wherein the upper and lower clad layers have a substantially identical thickness.

8. The light-emitting diode according to claim 5, wherein the lower clad layer has a thickness of d nm and the light emitted from the light-emitting layer has a wavelength of $\lambda$ nm, and the thickness and wavelength have a relation $\lambda \approx 0.135d + 380$ (provided that 420 nm $\leq \lambda \leq$ 490 nm).

* * * * *